(12) United States Patent
Happ

(10) Patent No.: US 7,023,008 B1
(45) Date of Patent: Apr. 4, 2006

(54) RESISTIVE MEMORY ELEMENT

(75) Inventor: Thomas Happ, Pleasantville, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/953,606

(22) Filed: Sep. 30, 2004

(51) Int. Cl.
*H01L 47/00* (2006.01)

(52) U.S. Cl. .......................... 257/3; 257/2; 257/4; 257/5
(58) Field of Classification Search ............ None
See application file for complete search history.

(56) References Cited

U.S. PATENT DOCUMENTS 6,114,713 A * 9/2000 Zahorik .......................... 257/4

2004/0165422 A1 * 8/2004 Hideki et al. .................. 365/163

* cited by examiner

*Primary Examiner*—Andy Huynh
(74) *Attorney, Agent, or Firm*—Edell, Shapiro & Finnan, LLC

(57) ABSTRACT

An electrically operated, resistive memory element includes a volume of resistive memory material, adapted to be switched between different detectable resistive states in response to selected enery pulses; means for delivering electrical signals to at least a portion of the volume of resistive memory material; and a volume of heating material for Ohmic heating of the resistive memory material in response to the electrical signals. The volume of heating material is embedded in the volume of resistive memory material.

21 Claims, 2 Drawing Sheets

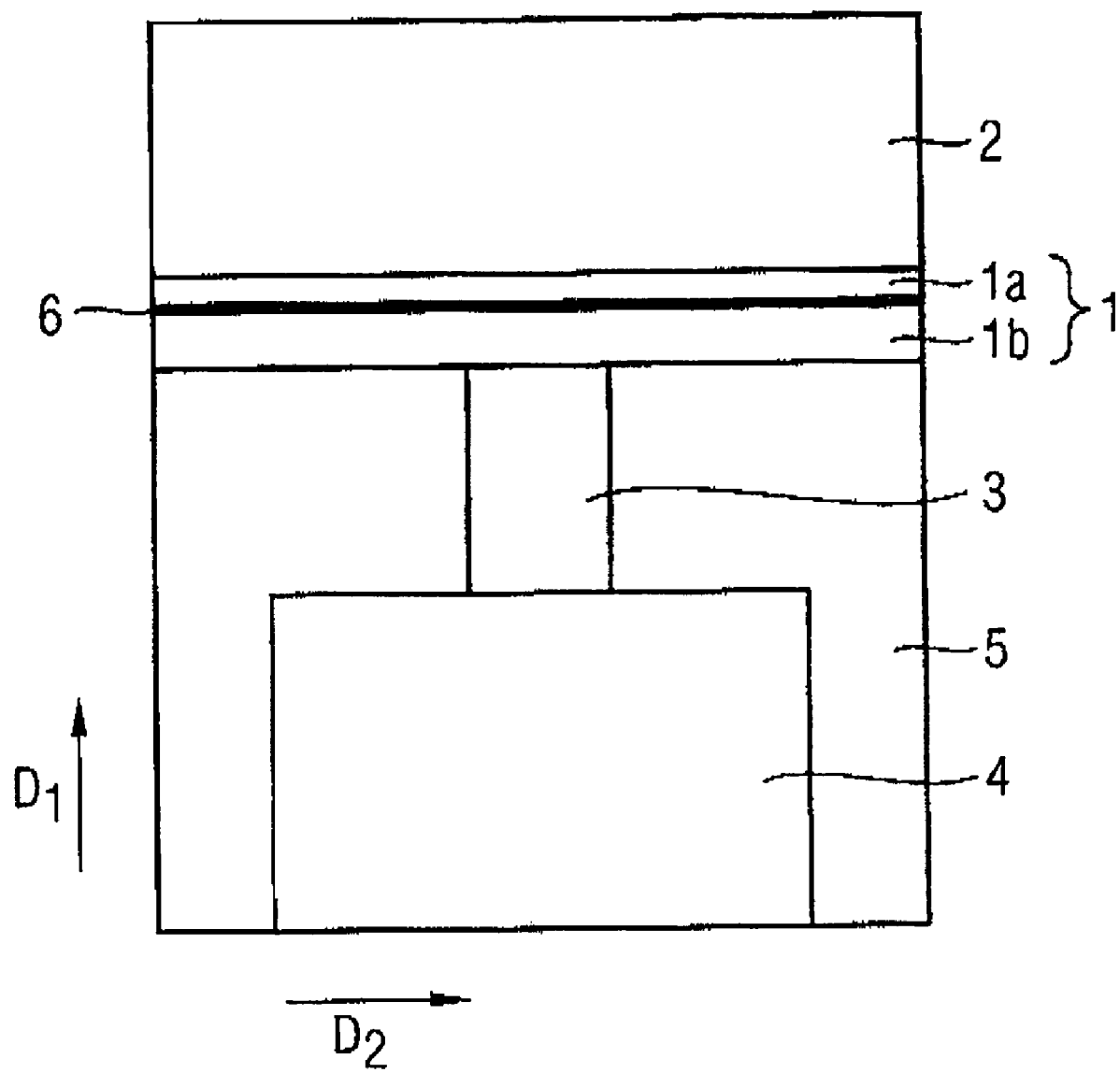

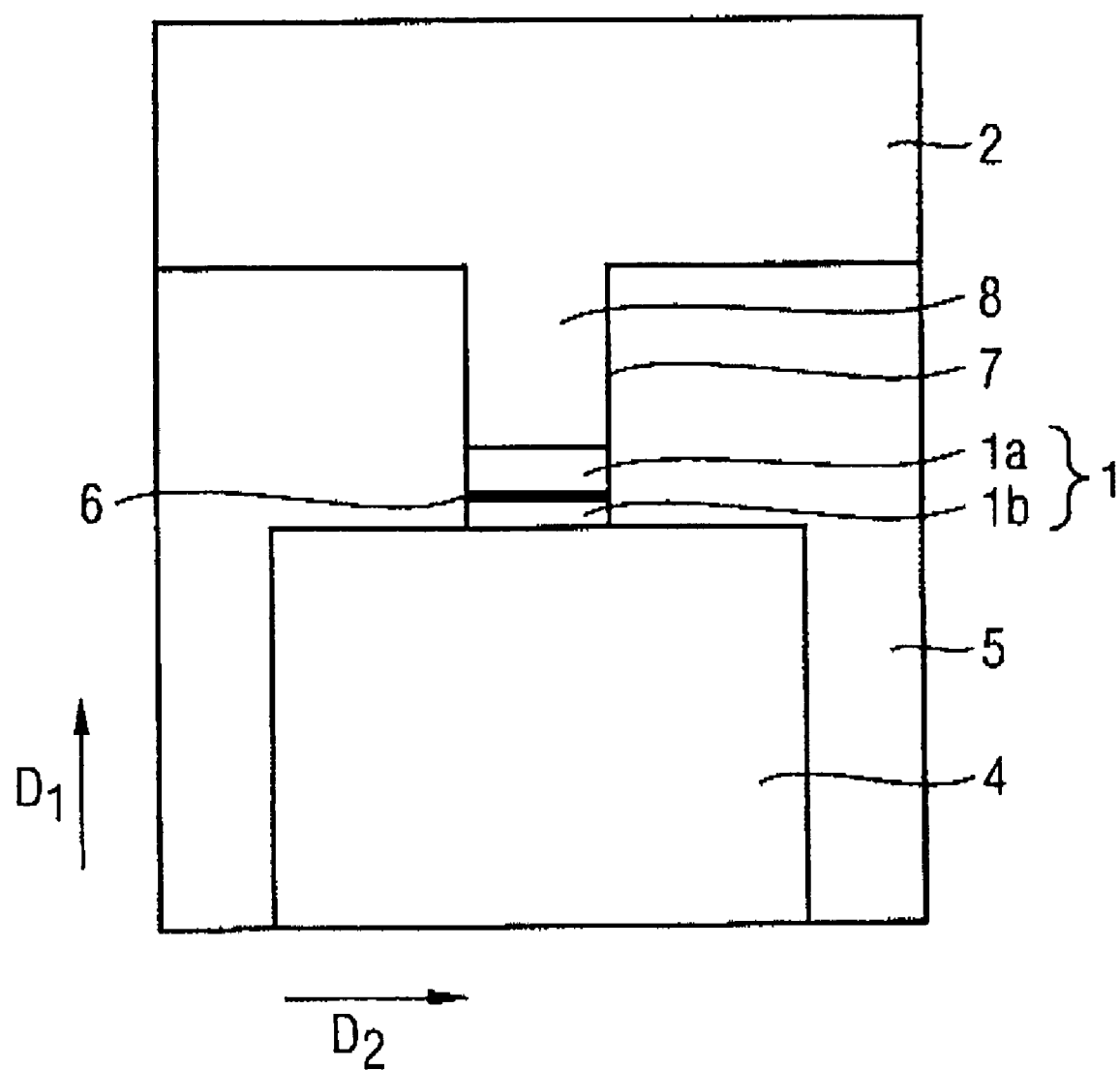

RESISTIVE MEMORY ELEMENT

FIELD OF THE INVENTION

This invention relates to non-volatile semiconductor memory chips, and more particularly, relates to an electrically operated, resistive memory element including a volume of resistive memory material, such as a phase change material.

BACKGROUND

Optically rewritable disks, such as compact disks (CDs) or digital versatile disks (DVDs), typically use phase change materials for storing information, which, using a laser beam, are switched between their crystalline and amorphous states. Since the optical reflectivity of the phase change material differs in its crystalline and amorphous states, a change of phase can be used to store and read digital information.

As has been found, amorphous and crystalline states not only differ in their optical reflectivities, but also in their electric resistivity values, so that a particular state can also be read electrically. This is the reason why resistive memory cells based on phase change materials may represent a new type of non-volatile memory cells that could replace the dynamic random access memory (DRAM) as the standard memory for computing devices. Particularly, the use of phase change memory devices as a non-volatile RAM will eventually allow for "instant on" systems that come to life as soon as the computer system is turned on, thus saving the amount of time needed for a conventional computer to transfer boot data from a hard disk drive to volatile DRAM during system power up.

Specific alloys having at least one element of group VI of the periodic table of elements, such as Te or Se, also referred to as chalcogenides, may be used in resistive memory cell applications, since the electric resistivity has been found to vary by at least two order of magnitudes when such alloy is switched between the more resistive amorphous phase and the less resistive crystalline phase.

An amorphous-crystalline phase transition of the phase change material is induced by raising the temperature above crystallization temperature of the material, so that a fast nucleation of crystallites can take place. Such transition starting from the amorphous phase and arriving at the crystalline phase typically is referred to as "writing" a memory cell. To bring the phase change material back to its amorphous state, it is necessary to raise the temperature above the melting temperature of the material and then cool off rapidly. Such transition starting from the crystalline phase and arriving at the amorphous phase typically is referred to as "erasing" a memory cell. Both crystallization and melting temperatures can, for instance, be reached by causing a current to flow through a resistive element, which heats the phase change material by the Joule effect.

For electrically reading the state of a memory cell using a phase change material, a reading voltage is applied to the cell, with the proviso that the reading current resulting therefrom must be smaller than the currents for writing or erasing in order to not effect an inadvertent writing or erasing of the memory cell.

However, a considerable drawback of such phase change memory cells is seen in the relatively high writing and erasing currents, which must be applied to a selected memory cell to raise the temperature of the phase change material above the crystallization and melting temperatures. In order to successfully integrate such phase change memory cells into convenient silicon CMOS processing the following has to be observed: if the electric currents, which are applied for reading or erasing a phase change memory cell, are too big to be supplied by a single CMOS tranistor having a minimum structure size, there is no possibility to realize a compact memory cell array comprising single memory cells in a 1 transistor/1 resistor-arrangement having a cell size of not more than 5–8 $F^2$ (where F is the minimum feature size of the technology used for fabrication) is not possible. If the above precondition is met, at present, a maximum electric current ranging from 50 to 100 µA (dependent from the actual structure size) can be supplied by a single transistor. Accordingly, a further reduction of writing and erasing currents of the phase change memory cells is highly advantageous, since energy consumed by the memory device can be lowered and parallel programming of the phase change memory cells can be enabled.

So far, in efforts to reduce writing and erasing currents, developers have attempted to diminish the programmable volume of the phase change material by reducing a contact area between the heating electrode and the phase change material, since currents necessary for writing or erasing typically scale with the programmable volume of the phase change material. Such known undertakings, however, are limited by the minimum (photo-)lithographic dimensions which can be reached, which at present typically amount to about 100 nm. Furthermore, doping of the phase change material using doping materials, such as nitrogen in order to enhance the speficic resistivity to gain a reduction in heating currents, is also known. However, because of physical limitations, not more than about 10% nitrogen can be introduced into the phase change material, and, in doping the phase change material other material parameters, such as crystallization temperature, crystallization speed, grain size and the like, are likely to be changed which may result in undesired effects.

A resistive memory element which further reduces heating currents, i.e., writing or erasing currents, of the resistive memory material, such as a phase change material, without being bound to physical size limitations of the technology used for fabrication or having adverse effects on material parameters of the resistive memory material is desirable.

SUMMARY

An electrically operated, resistive memory element for use in a resistive memory cell, has a volume of resistive memory material, that is adapted to be switched between different detectable resistive states in response to selected enery pulses applied thereto. Throughout this specification, the terms "resistive memory element" and "resistive memory material," respectively, are used to describe resistive memory cells and resistive memory materials, respectively, of any kind, which can be brought into two or more states exhibiting different electrical resistance values, such as phase change materials. The resistive memory element further includes a means for delivering electrical signals to at least a portion of the volume of the resistive memory material, which may be, for example, first and second electrical contacts, which adjoin the resistive memory material. The resistive memory element also includes a volume of heating material for Ohmic heating of the resistive memory material in response to the electrical signals being supplied by the first and second electrical contacts. The heating material is embedded (integrated) in the volume of resistive memory material. The heating material, for instance, is selected to have a specific electrical resistivity value relatively greater than that one of the resistive memory material in its lowest resistance state so that it can effectively be used for heating of the resistive memory material. The specific electric resistivity of the heating material may be chosen to meet specific requirements and typically can be varied within a broad range of possible specific electric resistivity values. In the case where the natural specific resistivity of the resistive memory material is very low (e.g., <5 mΩcm), this choice is required to enable low current memory operation.

Integrating (embedding) the heating material into the resistive memory material allows the total electric resistivity of the active material formed by the volume of resistive memory material and the volume of heating material embedded therein to be adjusted, without adverse effects on other material characteristices of the active material, such as its crystallization behavior. Enhancing the operating voltage of the resistive memory cell having the resistive memory element, for instance, from 0.3 Volts to 1 Volt, the currents necessary for heating the resistive memory material above critic temperatures of the resistive memory material in writing or erasing the resistive memory cell can be reduced. In general, a trade-off between enhancing the operating voltage and reducing the heating currents for writing or erasing the memory cell may be attained. Furthermore, embedding the heating material into the resistive memory material can minimize the thermal losses due to thermal conductivity.

In a first embodiment of the invention, one of the first and second electrical contacts providing a means for supplying electric signals is chosen to be a heater electrode for heating the resistive memory material using the Joule effect. The term "heater electrode" as used in the present invention describes an electrode with relatively smaller contact dimension than the counter electrode in order to locally increase the current density in the resistive memory material. In that embodiment, the resistive memory element may also include a layer made of the resistive memory material sandwiched between the heater electrode and the volume of resistive memory material.

In a second embodiment of the invention, one of the first and second electrical contacts is a plug electrode adapted to be connected to a transistor device. In the second embodiment, a via opening can be provided between the plug and the other one of the first and second electrical contacts, where the via opening is partly or completely filled with the resistive memory material, which is contacting the plug.

According to the invention, the volume of heating material forms at least one heating material layer, and, together with the resistive memory material may, for example, be arranged in a stacked overlying relationship. The at least one layer made of heating material, for instance, has a thickness in the range of 2 to 70 nanometers, and, more specifically, lies in the range of 5 to 20 nanometers. Particularly, using a heating material having a relatively high specific resistivity and, for instance, relatively low specific thermal capacity, the heating layer may be a very thin layer which, for instance, may have a thickness as thin as 5 nanometers. Accordingly, since the heating layer has a very low thermal capacity, relatively little additional thermal energy for heating the heating layer itself is supplied.

In the first embodiment of the invention, a distance between the heating material layer and the heater electrode under certain circumstances, for example, is chosen to be relatively greater than a distance between the heating material layer and the other one of the first and second electrical contacts.

Otherwise, in the second embodiment of the invention, a distance between the heating material layer and the electrical contact, for instance, is chosen to be relatively greater than a distance between the heating material layer and the plug.

According to the invention, the heating material is selected, for example, to have a thermal conductivity being relativley greater than that one of the resistive memory material. In that case, an improved homogeneous lateral distribution of temperature across the memory element may be achieved. Since local over-heating can be avoided by that measure, life-time of the memory cell can be enhanced, and, positive effects on the reading signal may also be observed.

In the resistive memory element according to the invention, the resistive memory material, for instance, is chosen to be a phase change material. In one embodiment, the phase change material includes, for instance, at least one chalcogen element, and may, for instance, be $Ge_2Sb_2Te_5$.

In the resistive memory element according to the invention, the heating material, for instance, is selected from the group including $TiO_xN_y$, $TiSi_xN_y$, $TiAl_xN_y$, $TaAl_xN_y$, $TaSi_xN_y$, $TaO_xN_y$, and C (graphitic or DLC). The exact material properties can be tuned by adjusting the material composition properly selecting x and y. Particularly, in selecting stoichiometry of such heating materials, the specific resistivity can be adjusted over a broad range of resistivity values, and, thus specific requirements can be met.

In the resistive memory element of the invention for use in a resistive memory cell, it is possible to further reduce heating currents with regard to prior art solutions without being limited to a specific technology for fabrication and without adverse effects on crystallization characteristics. Thus, a further reduction in size of the memory element is possible for a memory cell in 5 to 8 $F^2$ size in convenient silicon CMOS processing, where F is the minimum feature size of the technology used.

Other and further features of the invention will appear more fully from the following description.

BRIEF DESCRIPTION OF THE DRAWINGS

The accompanying drawings, which are incorporated herein and constitute a part of the specification, illustrate present embodiments of the invention, and together with the general description given above and the detailed description given below, serve to explain the principles of the invention.

FIG. 1 is a schematic vertical sectional view of an embodiment of a resistive memory element of the present invention; and FIG. 2 is a schematic vertical sectional view of another embodiment of a resistive memory element of the present invention.

Embodiments of the present invention will be described in detail below with reference to the accompanying drawings, where like designations denote like elements.

DETAILED DESCRIPTION

Referring to FIG. 1, a resistive memory element includesa resistive memory material and a heating material. Based on a conventional heater electrode geometry, an electrically operated, resistive memory element has a resistive memory material 1, which in the present embodiment is an alloy having at least one chalcogenid, such as $Ge_2Sb_2Te_5$. The phase change material 1 is sandwiched between a top electrode 2 and a bottom electrode 3, i.e., both electrodes adjoin the phase change material in direct electrical contact.

Top and bottom electrodes are, for instance, made of TiN or W or the like. In that embodiment, the bottom electrode 3 is formed as heating electrode having a smaller lateral dimension than the top electrode 2. The bottom electrode 3 is further connected to a plug electrode 4 arranged below of it, for instance, made of W, which is in electric contact with the source-drain-path of a transistor device (not shown in the drawings). Both bottom electrode 3 and plug electrode 4 are surrounded by an isolating material 5, such as $SiO_2$. Within the phase change material 1, a heating layer 6 for heating the phase change material 1, for instance, made of $TiO_xN_y$, C, $TiAl_xN_y$, $TiSi_xN_y$, $TaSi_xN_y$, or the like, is embedded, such that an upper part 1a and a lower part 1b of the phase change material 1 is formed. As is illustrated in FIG. 1, due to the relatively larger thermal diffusivity of the top electrode 2 relative to the bottom electrode 3, the heating layer 6 is located closer to the top electrode 2 than to the bottom electrode 3, i.e., the distance between heating layer 6 and top electrode 2 is relatively smaller than the distance between heating layer 6 and bottom electrode 3.

In FIG. 1, in an upward-downward direction referred to as D1, the upper part 1a of the phase change material 1 layer has a thickness of about 10 nm, the lower part 1b of the phase change material 1 has a thickness of about 20 nm, and the heating layer 6 has a thickness of about 5 nm. Further, the top electrode 2 has a thickness of about 140 nm, the bottom electrode 3 has a thickness of about 100 nm, and the plug electrode 4 has a thickness of about 175 nm. In FIG. 1, in left-right direction referred to as D2, the bottom electrode 3 has a width of about 60 nm, and the plug electrode 4 has a width of about 280 nm.

Referring to FIG. 2, another embodiment of the resistive memory element has a resistive memory material and a heating material. Based on a conventional active material-in-via geometry, the electrically operated, resistive memory element has a resistive memory material 1, which in the present embodiment, as in the embodiment of FIG. 1, is an alloy containing at least one chalcogenid, such as $Ge_2Sb_2Te_5$. The phase change material 1 is sandwiched between a top electrode 2 and a plug electrode 4, i.e., both electrodes adjoin the phase change material in direct electrical contact. The top electrode is, for instance, made of TiN or W or the like, while the plug electrode 4, for instance, is made of W or the like, and is in electric contact with the source-drain-path of a transistor device (not shown in the drawings). The phase change material 1 is partly filled in a via opening 7 between top electrode 2 and plug electrode 4. The remaining part of the partly filled via opening 7 is filled with a via opening part 8 of the top electrode 2. While not shown in FIG. 2, the via opening 7 can be relatively completely filled with the phase change material 1. Both via connection 7 and plug electrode 4 are surrounded by an isolating material 5, such as $SiO_2$. Within the phase change material 1, a heating layer 6 for heating the phase change material 1, for instance, made of $TiO_xN_y$, C, $TiAl_xN_y$, $TiSi_xN_y$, $TaSi_xN_y$, $TaAl_xN_y$, $TaO_xN_y$ or the like, is embedded, such that an upper part 1a and a lower part 1b of the phase change material 1 is formed. As is illustrated in FIG. 2, due to the relatively larger thermal diffusivity of the plug electrode 4 relative to the protruding part 8 of the top electrode 2, the heating layer 6 is located relatively closer to the plug electrode 4 than to the top electrode 2, i.e., the distance between heating layer 6 and plug electrode 4 is relatively smaller than the distance between heating layer 6 and protruding part 8 of the top electrode 2.

In FIG. 2, in an upward-downward direction referred to as D1, the upper part 1a of the phase change material 1 layer has a thickness of about 20 nm, the lower part 1b of the phase change material 1 has a thickness of about 10 nm, and the heating layer 6 has a thickness of about 5 nm. Further, the top electrode 2 (without protruding part 8) has a thickness of about 100 nm, the protruding part 8 of the top electrode 2 has a thickness of 100 nm, and the plug electrode 4 has a thickness of about 225 nm. In FIG. 1, in left-right direction referred to as D2, the protruding part 8 of the top electrode 2, the phase change material 1 and the heating layer 6 each have a width of about 60 nm, and the plug electrode 4 has a width of about 260 nm.

Numeric simulations using the heater geometry as shown in FIG. 1 and the active material-in-via geometry as shown in FIG. 2 brought the following results:

In both the above cases, a thermal conductivity of 10 W/m·K, density of 5240 kg/m³, specific thermal capacity of 784 J/kg·K and specific resistivity of $5·10^3$ Ohm·m for the heating layer made of $TiO_xN_y$ have been assumed.

Heater geometry: $I_{reset}$ (current for erasing the memory cell) for 30 nm thickness $Ge_2Sb_2Te_5$ reference without heating layer amounts to about 1200 μA, and with heating layer is reduced to about 882 μA.

Active material-in-via geometry: $I_{reset}$ (current for erasing the memory cell) for 30 nm thickness $Ge_2Sb_2Te_5$ reference without heating layer amounts to about 665 μA, and with heating layer is reduced to about 175 μA.

In the resistive memory of the invention using the heating material, the total electric resistivity can be enhanced without having adverse effects on specific characteristics of the resistive memory material.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

REFERENCE LIST

1 Phase change material
1a Upper part
1b Lower part
2 Top electrode
3 Bottom electrode
4 Plug electrode
5 Isolating material
6 Heating material
7 Via opening
8 Via part of top electrode

I claim:
1. An electrically operated, resistive memory element, comprising:
 a volume of resistive memory material, the volume of resistive memory material adapted to be switched between different detectable resistive states in response to selected enery pulses;
 means for delivering electrical signals to at least a portion of the volume of resistive memory material; and
 a volume of heating material for Ohmic heating of the resistive memory material in response to the electrical signals, the volume of heating material being embedded in the volume of resistive memory material.

2. The resistive memory element of claim 1, wherein the heating material has an electric resistivity which is higher than an electric resistivity of the resistive memory material in its lowest resistive state.

3. The resistive memory element of claim 1, wherein the means for delivering electrical signals comprises a first electrical contact and a second electrical contact adjoining the resistive memory material.

4. The resistive memory element of claim 3, wherein one of the first and second electrical contacts comprises a heater electrode.

5. The resistive memory element of claim 3, wherein one of the first and second electrical contacts comprises a plug electrode adapted to be connected to a transistor device.

6. The resistive memory element of claim 5, further comprising:
a via opening, the via opening being diposed between the plug and the other one of the first and second electrical contacts, the via opening being at least partly filled with the resistive memory material contacting the plug.

7. The resistive memory element of claim 1, wherein the volume of heating material forms at least one heating material layer.

8. The resistive memory element of claim 4, wherein a distance between the heating material layer and the heater electrode is greater than a distance between the heating material layer and the other one of the first and second electrical contacts.

9. The resistive memory element of claim 6, wherein a distance between the heating material layer and the top electrode is greater than a distance between the heating material layer and the plug.

10. The resistive memory element of claim 4, further comprising a layer made of the resistive memory material sandwiched between the heater electrode and the volume of resistive memory material.

11. The resistive memory element of claim 7, wherein the resistive memory material layer has a thickness in the range of 2 to 70 nanometers.

12. The resistive memory element of claim 7, wherein the resistive memory material layer has a thickness in the range of 5 to 20 nanometers.

13. The resistive memory element of claim 1, wherein the heating material is selected to have a thermal conductivity being greater than that one of the resistive memory material.

14. The resistive memory element of claim 1, wherein the resistive memory material is a phase change material.

15. The resistive memory element of claim 14, wherein the phase change material includes at least one chalcogen element.

16. The resistive memory element of claim 15, wherein the phase change material is $Ge_2Sb_2Te_5$.

17. The resistive memory element of claim 1, wherein the heating material is selected from the group comprising $TiO_xN_y$, $TiSi_xN_y$, $TiAl_xN_y$, $TaAl_xN_y$, $TaSi_xN_y$, $TaO_xN_y$, where x and y are positive numbers, and C.

18. The resistive memory element of claim 1, wherein the resistive memory element is realized in 5 to 8 $F^2$ size.

19. The resistive memory element of claim 7, wherein a distance between the heating material layer and the heater electrode is greater than a distance between the heating material layer and the other one of the first and second electrical contacts.

20. The resistive memory element of claim 7, wherein a distance between the heating material layer and the top electrode is greater than a distance between the heating material layer and the plug.

21. The resistive memory element of claim 7, further comprising a layer made of the resistive memory material sandwiched between the heater electrode and the volume of resistive memory material.

* * * * *